Figure 1:
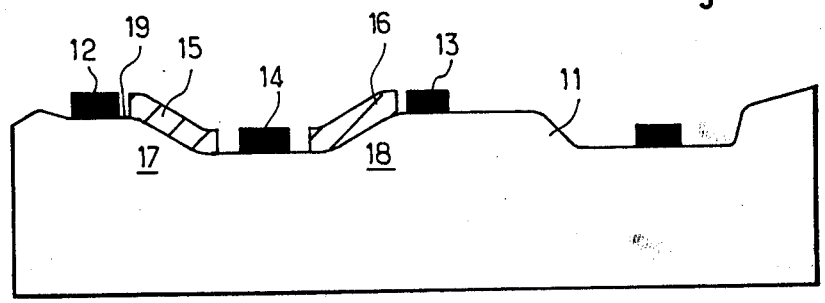

United States Patent [19]

Meinguss et al.

[11] 4,434,361
[45] Feb. 28, 1984

[54] TRANSISTOR INTEGRATED CIRCUIT PROTECTED AGAINST THE ANALYSIS, AND A CARD COMPRISING SUCH A CIRCUIT

[75] Inventors: Alain Meinguss, Meudon la Foret; Bernard Despres, Paris, both of France

[73] Assignee: Electronique Marcel Dassault, Paris, France

[21] Appl. No.: 211,968

[22] Filed: Dec. 1, 1980

[30] Foreign Application Priority Data

Nov. 30, 1979 [FR] France ................................. 7929590

[51] Int. Cl.³ .............................................. G06K 7/06
[52] U.S. Cl. ................................. 235/192; 235/187; 235/380; 357/84; 340/825.33
[58] Field of Search ............... 235/487, 490, 492, 468; 340/825.33; 357/84

[56] References Cited

U.S. PATENT DOCUMENTS

| 3,518,494 | 6/1970 | James | 317/101 |
| 3,868,057 | 2/1975 | Chavez | 235/61.7 B |
| 4,067,099 | 1/1978 | Ito et al. | 29/571 |
| 4,221,240 | 10/1978 | Katto | 357/52 |

Primary Examiner—G. Z. Rubinson
Assistant Examiner—Robert Lev
Attorney, Agent, or Firm—Pollock, Vande Sande & Priddy

[57] ABSTRACT

A transistor integrated circuit particularly for use in transaction cards such as credit cards or payment cards comprises conductive film zones on the surface of the circuit having a shape and layout which makes it difficult or impossible to determine the layout of the circuit. Additional metal zones may be formed at the level or below the level of the transistor connection strips, which cannot be eliminated without eliminating the strips. Alternatively, instead of strips, metal zones extended in two dimensions are used whereby their junction to an underlying transistor may not be easily located by observing their surface by microscopic means.

4 Claims, 4 Drawing Figures

TRANSISTOR INTEGRATED CIRCUIT PROTECTED AGAINST THE ANALYSIS, AND A CARD COMPRISING SUCH A CIRCUIT

The invention relates to transistor integrated circuits.

For some uses, it is desirable to prevent, or to make very difficult, the determination of the electrical current paths in an integrated circuit. This is for example the case where the integrated circuit is part of a card intended for being used in financial and/or commercial transactions, and to avoid disclosing information derived from the analysis of the integrated circuit or circuits of the card to carry out transactions to the prejudice of third persons.

To analyze an integrated circuit, a scanning electron microscope permits determination of the configuration of the electrical current paths.

The invention is characterized in that areas of a transistor integrated circuit are coated with a conductive film adjacent regions which do not interfere with the conductive tracks provided for the electrical connections with the transistors.

The analysis of the elements underlying said film is made practically impossible, even with the assistance of a scanning electron microscope.

It has been established that the presence of a metallic film covering MOS transistors is not a detriment for the operation of the latter, particularly in the application to electronic circuit cards where a decrease in the operation speed is not a hindrance.

Consequently, and according to the invention, an integrated circuit comprises, not only transistors and conductors or tracks adapted for providing the electrical connections useful for the operation of the integrated circuit, but also superficial conductive regions which do not interfere with the connections between transistors.

Advantageously, the metallic regions are obtained by a method similar to that used for the formation of the conductive tracks and can be produced simultaneously.

The invention does not preclude the circulation of electrical currents underlying a conductive region, thereby taking advantage of the surface irregularity of the MOS transistors in the configuration imparted to them during the usual manufacturing technique.

Generally, the metallic regions are preferably at the same level as the conductors or at a lower level, so that an attempt to eliminate said regions, in an attempted fraud, brings about the destruction of the conductive tracks.

The invention is applicable to integrated circuits in which all the transistors are operative.

It applies also to the the integrated circuits comprising, as a security device against fraud, superabundant transistors which are in a state equivalent to short-circuits or to open circuits.

Figure 2:
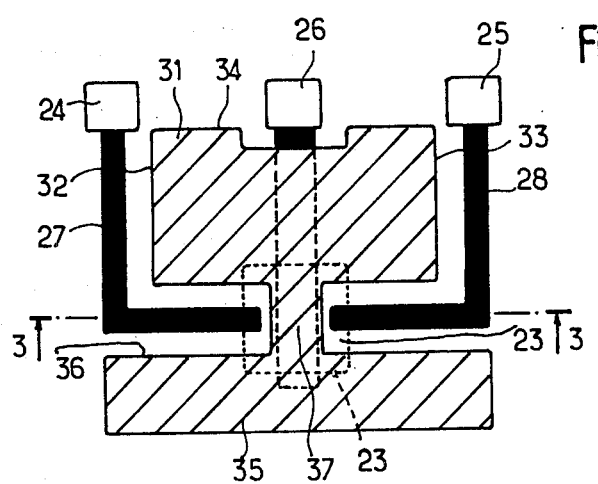
Figure 3:
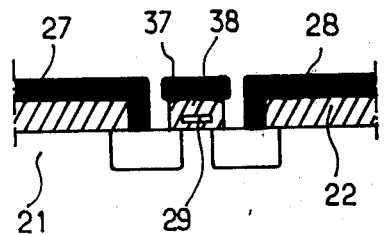
Figure 4:
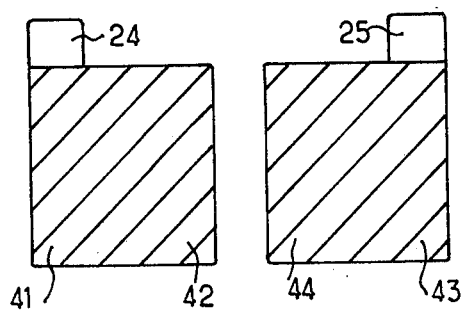

The description which is now given by way of example refers to the accompanying drawings in which:

FIG. 1 is a cross-sectional schematic view of part of a MOS transistor chip according to the invention, FIG. 2 is a plan schematic view of a portion of a chip adjacent a transistor, FIG. 3 is a sectional view along line 3—3 of FIG. 2, FIG. 4 shows very schematically an alternative embodiment, in a plan-view.

Reference is first made to FIG. 1. On substrate 11 of a silicon wafer by the usual process of plating, followed by an engraving operation and a chemical etching operation, conductive strips or tracks 12, 13, 14 for the respective connections of the drain, the source and the grid or gate of a MOS transistor, are obtained.

According to the invention, conductive regions 15 and 16 which are separate from the strips are formed on said substrate, for example during the plating process. The regions cover the underlying zones 17, 18 and prevent the observation of the semiconductor surface 19.

Preferably, the regions 15, 16 have an electrical conductivity relationship between themselves where they can be maintained at the same potential.

The elimination of said regions, in an attempt to analyze the integrated circuit comprising such a transistor, cannot be practically carried out without adversely affecting the conductive strips 12, 13, 14, so that it is not possible, thereafter, to electrically feed the transistors of the integrated circuit, the construction of which a person who attempts a fraud wishes to know.

It is also not possible to subject the coated regions of the semiconductor where a diffusion has been initially carried out during doping to ultraviolet radiation or similar radiation.

Reference is now made to FIGS. 2 and 3. The body 21 of the semiconductor (silicon) is coated with an oxide layer 22. The electrical connections to a MOS transistor 23 formed in the silicon are provided from contacts 24, 25, 26 through a conductive strip 27 for the drain, a conductive strip 28 for the source and a conductive strip 29 for the gate, the last strip being out of level relative to strips 27 and 28.

According to the invention, in this embodiment, the surface of the "chip" or "wafer" comprising said transistor, and the adjacent portions, are coated with a metallic film forming a first region 31 of general rectangular shape remaining at a distance, by its edges 32 and 33 respectively from strips 27 and 28, and by its edge 34 from contacts 24, 25 and 26; a second metallic layer 35 remains at a distance, by its edge 36, from strips 27 and 28; the regions 31 and 35 are joined by connection 37 remaining at a distance from the ends of strips 27 and 28 and separated from strip 29 by the underlying oxide layer 38.

In the embodiment according to FIG. 4, which is a view similar to that of FIG. 2, there depends from contact 24, instead of a strip 27, a metallic region 41 an angular zone 42 of which is in contact with the drain of a transistor similar to transistor 23 of FIG. 2, overlying the latter, via a conductive connection perpendicularly to the plane of the FIGURE. Instead of the strip 28, there depends from contact 25 a second metallic region 43, an angular zone 44 of which is in contact with the source of said transistor, overlying the latter, via a conductive connection perpendicularly to the plane of the FIGURE.

As in the case of FIGS. 2 and 3, a conductive strip, not shown, similar to strip 29, may be provided for the grid 38, imbedded in the oxide layer 38, said layer not being topped by a metal plating 37 in this example.

The metallic zones 41 and 44 form connections which protrude surface-wise relative to contacts 24 and 25, and relative to the transistor itself to which they are connected, thereby making uncertain the determination of the circuit configuration. In fact, as is shown in FIG. 4, the junction between the conductors 41 and 44 and the transistor is not visible and it is not possible, by the observation alone, to localize exactly the underlying transistor.

The extended surface area of the metallic regions increases the difficulty of observing the interconnections, even when using a scanning electron microscope.

In the various embodiments, the presence of a metallic film precludes the action of ultraviolet radiation, thereby providing the protection against unauthorized disclosure programmable integrated circuits.

We claim:

1. A transistor integrated circuit having a substrate with at least one integrated transistor formed in said substrate and a plurality of connections to said transistor comprising:
   a conduction element on the surface of said substrate connected to an electrode of said transistor, and
   a metallic zone on or beneath said surface, electrically isolated from said transistor, said metallic zone positioned with respect to said transistor to make analyses of integrated circuit connections difficult.

2. The integrated circuit of claim 1 mounted to a circuit card which constitutes a transaction card.

3. An integrated ciircuit according to claim 1, wherein at least one electrical connection to said transistor is formed below the level of said surface.

4. An integrated circuit which provides a unique electrical path to initiate a secure transaction comprising:
   a substrate having a plurality of transistors forming open and closed circuit paths;
   interconnecting strips connecting electrodes of said transistors to form said electrical path; and
   a conductive film on said substrate adjacent said interconnecting strips covering said transistors and electrically isolated therefrom, said film forming regions interconnected to maintain a common voltage potential, whereby the proximity of said conductive film to said interconnecting strips and position over said transistors makes analysis of said electrical circuit path difficult.

* * * * *